United States Patent
Sunohara et al.

(10) Patent No.: US 7,745,939 B2
(45) Date of Patent: Jun. 29, 2010

(54) SEMICONDUCTOR DEVICE AND METHOD OF MANUFACTURING THE SAME

(75) Inventors: Masahiro Sunohara, Nagano (JP); Mitsutoshi Higashi, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 216 days.

(21) Appl. No.: 11/509,716

(22) Filed: Aug. 25, 2006

(65) Prior Publication Data

US 2007/0045746 A1 Mar. 1, 2007

(30) Foreign Application Priority Data

Aug. 29, 2005 (JP) ............................ P2005-248398

(51) Int. Cl.
*H01L 23/48* (2006.01)

(52) U.S. Cl. .............................. 257/774; 257/E23.011; 257/E21.597

(58) Field of Classification Search ................ 257/678, 257/360, E21.597, E21.508, 686, 777, 774, 257/623–625, 621, 701, 702, 709, 729, E23.011, 257/E23.067; 438/125, 617, 675–679, 687
See application file for complete search history.

(56) References Cited

U.S. PATENT DOCUMENTS

| | | | | | |
|---|---|---|---|---|---|
| 6,330,377 | B1 * | 12/2001 | Kosemura | ...................... | 385/14 |
| 6,383,835 | B1 * | 5/2002 | Hata et al. | ...................... | 438/65 |
| 7,173,324 | B2 * | 2/2007 | Lee et al. | ...................... | 257/684 |
| 7,193,297 | B2 * | 3/2007 | Yamaguchi | .................. | 257/621 |
| 7,282,787 | B2 * | 10/2007 | Pai et al. | ....................... | 257/678 |
| 7,294,897 | B2 * | 11/2007 | Akram et al. | ................ | 257/434 |
| 7,419,841 | B2 * | 9/2008 | Farnworth et al. | ............. | 438/26 |
| 2002/0180055 | A1 * | 12/2002 | Takahashi et al. | ............ | 257/774 |
| 2002/0190375 | A1 * | 12/2002 | Mashino et al. | .............. | 257/734 |
| 2004/0147051 | A1 * | 7/2004 | Wada | ........................... | 438/22 |
| 2004/0238211 | A1 * | 12/2004 | Momokawa et al. | ......... | 174/260 |

(Continued)

FOREIGN PATENT DOCUMENTS

JP 63-156348 6/1988

(Continued)

OTHER PUBLICATIONS

Kenji Takahashi et al. "Process Integration of 3D Chip Stack with Vertical Interconnection." *Electronic Components and Technology Conference*, 2004, pp. 601-609.

*Primary Examiner*—W. David Coleman
*Assistant Examiner*—Latanya Crawford
(74) *Attorney, Agent, or Firm*—Drinker Biddle & Reath LLP

(57) ABSTRACT

A semiconductor device 50 is constructed to connect Al electrode pads 20 and rewiring patterns 52 via through electrodes 56 and flip-chip connect the rewiring patterns 52 of a semiconductor element 14 and wiring patterns 24 on a wiring substrate 12 via solder bumps 58. A device forming layer 18 and a plurality of Al electrode pads 20 are formed on an upper surface of the semiconductor element 14. Through holes 54 passing through the semiconductor element 14 are provided between the Al electrode pads 20 and the rewiring patterns 52 by the dry etching, and through electrodes 56 are formed in insides of the through holes 54 by the Cu plating. The device forming layer 18 is arranged on an upper surface of the semiconductor element 14 to make a light reception and a light emission easily.

2 Claims, 19 Drawing Sheets

U.S. PATENT DOCUMENTS

| | | | |
|---|---|---|---|
| 2004/0238927 A1* | 12/2004 | Miyazawa | 257/678 |
| 2004/0245649 A1* | 12/2004 | Imaoka | 257/774 |
| 2004/0251554 A1* | 12/2004 | Masuda | 257/773 |
| 2005/0001327 A1* | 1/2005 | Yamaguchi | 257/774 |
| 2005/0275048 A1* | 12/2005 | Farnworth et al. | 257/431 |
| 2005/0285154 A1* | 12/2005 | Akram et al. | 257/234 |
| 2006/0138629 A1* | 6/2006 | Fukazawa | 257/686 |
| 2006/0228825 A1* | 10/2006 | Hembree | 438/51 |
| 2006/0286789 A1* | 12/2006 | Sunohara et al. | 438/598 |
| 2007/0007639 A1* | 1/2007 | Fukazawa | 257/686 |
| 2007/0023888 A1* | 2/2007 | Fujii | 257/698 |

FOREIGN PATENT DOCUMENTS

| | | |
|---|---|---|
| JP | 02-239627 | 9/1990 |
| JP | 2004-221357 | 8/2004 |
| JP | 2004-327910 | 11/2004 |

* cited by examiner

PLASMA

PLASMA

SEMICONDUCTOR DEVICE AND METHOD OF MANUFACTURING THE SAME

TECHNICAL FIELD

The present invention relates to a semiconductor device constructed to form electrodes connected to electrode pads of a semiconductor element that has a device forming layer and electrode pads on its one surface side, and a method of manufacturing the same.

RELATED ART

For example, as the semiconductor device having such a structure that electrodes of the semiconductor element as typified by the optoelectronic element such as the light receiving element, the light emitting element, or the like, in which the device forming layer is formed on the substrate, are connected to the wiring patterns formed on the substrate, there is the semiconductor device constructed as shown in FIG. 11. In this semiconductor device 10, a semiconductor element 14 is adhered onto a wiring substrate 12 by an adhesive 16 and a device forming layer 18 and Al electrode pads 20 are formed on an upper surface of the semiconductor element 14. A plurality of Al electrode pads 20 provided around the device forming layer 18 are connected to wiring patterns 24 on the wiring substrate 12 via Au wires 22 stretched by the wire bonding. Also, a passivating layer (protection film) 26 is laminated on a surface of the device forming layer 18 (device surface).

In the semiconductor device 10 constructed in this manner, a space required to pull out the Au wires 22 must be provided around the semiconductor element 14 and thus a size of the overall device is increased. Therefore, it is difficult to attain a miniaturization of the device.

Also, the method of flip-chip connecting a plurality of Al electrode pads 20 to the wiring patterns 24 via the solder bumps may be considered. In this case, a light is blocked by the wiring substrate 12 because the device forming layer 18 opposes to the wiring substrate 12. Therefore, this method cannot be employed in the optoelectronic element whose device forming layer 18 receives a light or emits a light.

As the method to solve such problem, such an approach is considered that the above wiring bonding is eliminated by providing the through electrodes in the substrate to attain a size reduction of the device.

As the semiconductor device using the through electrodes, there is the stacked semiconductor device in which a plurality of semiconductor elements are stacked and respective semiconductor elements are connected by the through electrodes (see Patent Literature 1 (Japanese Patent Unexamined Publication No. Sho. 63-156348) and Non-Patent Literature 1 (Process Integration of 3D Chip Stack with Vertical Interconnection; Kenji Takahashi, Yuichi Taguchi, Manabu Tomisaki, Hitoshi Yonemura, Masatake Hoshino, Mitsuo Ueno, Yosimi Egawa, Yoshihiko Nemoto, Yasuhiro Yamaji, Hiroshi Terao, Mitsuo Umemoto, Kojiro Kameyama, Akira Suzuki, Yoshio Okayama, Toshihiro Yonezaki, Kazuo Kondo; Association of Super-Advanced Electronic Technologies (ASET)), for example).

Also, as the method of manufacturing the through electrodes in the related art, there is the method of filling the solder in the through holes in the semiconductor device (see Patent Literature 2 (Japanese Patent Unexamined Publication No. Hei. 2-239627 (Japanese Patent No. 2569789)), for example).

However, when the semiconductor element in which the device forming layer is formed on the substrate is flip-chip connected to the wiring substrate by using the methods set forth in Patent Literature 1 and Non-Patent Literature 1, the number of steps is increased and thus such method is unsuited to practical use. Also, such a problem existed in the manufacturing method set forth in Patent Literature 2 that it is difficult to fill the solder in the through holes when a diameter of the through hole is an infinitesimal hole diameter and thus it is difficult to deal with a size reduction of the semiconductor device.

Also, when it is requested that a fine through hole having a high aspect ratio should be formed, the method of employing the dry etching is considered. In this case, such a problem arises that the device forming layer of the semiconductor element is damaged depending on the plasma atmosphere in the dry etching.

SUMMARY

Embodiments of the present invention provide a semiconductor device capable of achieving a size reduction of the device and forming through holes and through electrodes in a state that a device forming layer is protected, and a method of manufacturing the same.

According to a first aspect of one or more embodiments of the invention, there is provided with a method of manufacturing a semiconductor device having a semiconductor element, which has a device forming layer and an electrode pad on one surface side, a wiring pattern formed on other surface side of the semiconductor element, and a through electrode that connects the electrode pad of the semiconductor element and the wiring pattern, the method comprising:

a first step of forming a first resist layer on one surface side of the semiconductor element;

a second step of forming an opening in centers of the first resist layer and the electrode pad by an etching;

a third step of forming a through hole in a position that is communicated with the opening in the semiconductor element;

a fourth step of forming an insulating layer on the other surface side of the semiconductor element and an inner periphery of the through hole;

a fifth step of removing a portion of the first resist layer, which covers a surface of the electrode pad;

a sixth step of forming a power feeding layer on the other surface side of the semiconductor element;

a seventh step of forming the through electrode in the through hole and on a surface of the electrode pad by depositing a conductive material on a portion of the power feeding layer opposing to the through hole by means of plating; and an eighth step of removing the power feeding layer.

In a second aspect of one or more embodiments of the invention, the first step contains a step of forming a metal layer on one surface side of the semiconductor element and a surface of the electrode pad, and the eighth step contains a step of removing the metal layer.

In a third aspect of one or more embodiments of the invention, the fifth step contains steps of forming a second resist layer on a surface of the first resist layer and then removing the first resist layer stacked on the surface of the electrode pad by an ashing.

In a fourth aspect of one or more embodiments of the invention, the fifth step contains a step of forming a protection film on the surface of the electrode pad, which is the first resist layer is removed.

In a fifth aspect of one or more embodiments of the invention, the fifth step contains a step of removing the protection film except the protection film that is stacked on the surface of the electrode pad by lifting off the second resist layer.

In a sixth aspect of one or more embodiments of the invention, the power feeding layer is adhered onto other surface side of the semiconductor element via an adhesive layer.

In a seventh aspect of one or more embodiments of the invention, the through electrode has a collar-like connection portion connected to the electrode pad over an entire circumference, and a rod-like connection portion formed in the through hole such that one end is coupled integrally to the collar-like connection portion and the other end is extended to other surface side of the semiconductor element.

According to a eight aspect of one or more embodiments of the invention, there is provided with a semiconductor device comprising:

a semiconductor element, which has a device forming layer and an electrode pad on one surface side;

a wiring pattern formed on other surface side of the semiconductor element; and a through electrode that connects the electrode pad of the semiconductor element and the wiring pattern, wherein the electrode pad has an opening in its center, the semiconductor element has a through hole, which is communicated with the opening of the electrode pad and passes through from one surface side of the semiconductor element to other surface side of the semiconductor element, and wherein the through electrode has a collar-like connection portion connected to the electrode pad over an entire circumference, and a rod-like connection portion formed in the through hole such that one end is coupled integrally to the collar-like connection portion and the other end is extended to other surface side of the semiconductor element.

In a ninth aspect of one or more embodiments of the invention, the device forming layer is an optically functioning element to receive a light and emit the light.

Various implementations may include one or more the following advantages. For example, since the first resist layer is formed on one surface side of the semiconductor element, the device forming layer can be protected from the plasma atmosphere when the opening is formed in the center of the resist layer and the electrode pad by the etching. In addition, the through electrodes are formed in the through holes and on the surfaces of the electrode pads by depositing the conductive material on the portions, which oppose to the through holes in the power feeding layer, by the plating. Therefore, the through electrodes with no void (cavity) can be formed even in the fine through holes, and thus a miniaturization of the semiconductor device can be achieved rather than the semiconductor device in which the semiconductor element is connected via the wire.

Also, since the metal layer is formed on one surface side of the semiconductor element and the surfaces of the electrode pads, the device forming layer can be protected from the plasma atmosphere and also oxidation of the surfaces of the electrode can be prevented. Also, since the second resist layer is formed on the surface of the first resist layer, the device forming layer can be protected by the second resist layer when the first resist layer stacked on the surfaces of the electrode pads is removed by the ashing.

Also, since the protection film is formed on the surfaces of the electrode pads, the electrode pads can be protected from the plating solution used when the electroplating is applied to the through holes. Also, the protection film except the protection film that is stacked on the surfaces of the electrode pads can be removed easily by lifting off the second resist layer.

Also, since the power feeding layer is adhered onto the other surface side of the semiconductor element via the adhesive layer, removal of the power feeding layer can be easily carried out.

Also, in case the device forming layer is composed of the optically functioning element, the through electrodes can formed in a state that the optically functioning element is arranged on the upper surface side of the substrate, the through electrodes can be fitted to the wiring substrate by the flip-chip connection via the rewiring on the other surface side of the semiconductor element, and the through electrodes can be constructed not to disturb a light reception or a light emission of the optically functioning element.

Also, the through electrode has the collar-like connection portion connected to the electrode pad over an entire circumference, and the rod-like connection portion formed in the through hole such that one end is coupled integrally to the collar-like connection portion and the other end is extended to other surface side of the semiconductor element. Therefore, electrical connection between the surfaces of the electrode pads and the through electrodes can be achieved without fail, and also the electrode pad can be protected because the collar-like connection portion covers the electrode pad.

DETAILED DESCRIPTION

A best mode for carrying out the present invention will be explained with reference to the drawings hereinafter.

Embodiment 1

Figure 1:
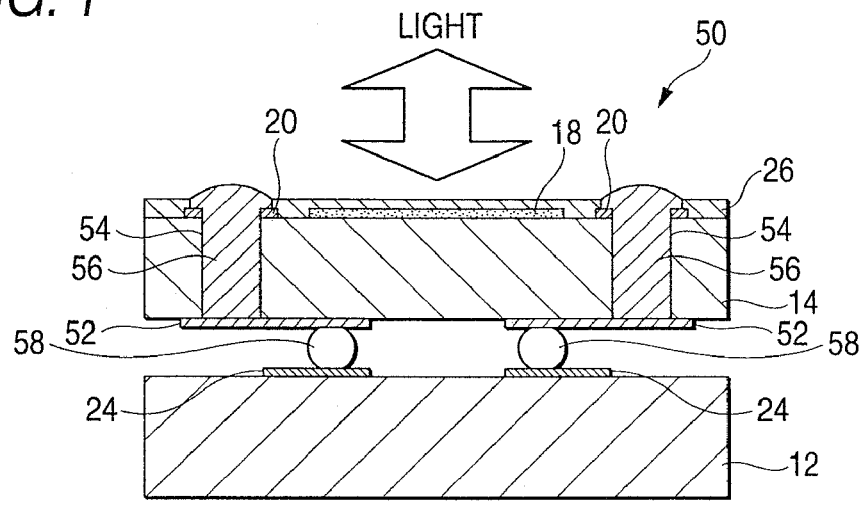
FIG. 1 is a longitudinal sectional view showing an embodiment of a semiconductor device according to the present invention.
Figure 11:
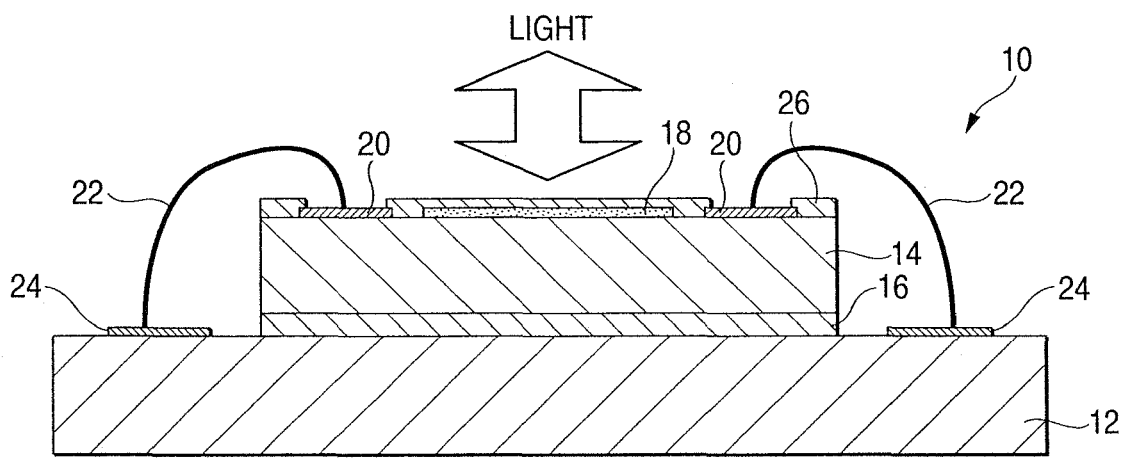
FIG. 11 is a view showing an example of a semiconductor device in the related art.

FIG. 1 is a longitudinal sectional view showing an embodiment of a semiconductor device according to the present invention. In FIG. 1, the same reference symbols are affixed to the same portions as those shown in FIG. 11. As shown in FIG. 1, a semiconductor device 50 is constructed by forming through electrodes 56, each connects the Al electrode pad 20 and rewiring pattern 52, in the semiconductor element 14 (including the device forming layer 18 formed of the optically functioning element, the Al electrode pads 20, the passivating layer 26, and an insulating layer 62). Also, for example, the light receiving element for receiving a light, the light emitting element for emitting a light, the image sensor for sensing a light to output an image signal, or the like is cited as the device forming layer 18.

A plurality of Al electrode pads 20 connected electrically to the device forming layer 18 are provided around the device forming layer 18, and the rewiring patterns 52 are provided on a lower surface of the semiconductor element 14. Through holes 54 passing through the semiconductor element 14 are provided between the Al electrode pads 20 and the rewiring patterns 52 by the dry etching. The through electrodes 56 are formed in insides of the through holes 54 by the Cu plating.

In addition, the rewiring patterns 52 provided on the lower surface of the semiconductor element 14 are connected to the wiring pattern 24 on the wiring substrate 12 via solder bumps 58.

In this manner, a semiconductor device 50 is constructed to connect the Al electrode pads 20 and the rewiring patterns 52 via the through electrodes 56 and flip-chip connect the rewiring patterns 52 of the semiconductor element 14 and the wiring patterns 24 on the wiring substrate 12 via the solder bumps 58. Therefore, a considerable size reduction can be realized rather than the configuration using the wire bonding (see FIG. 11) in the related art. In addition, since the device forming layer 18 is arranged on the upper surface of the semiconductor element 14, the semiconductor device 50 is constructed not to disturb the light reception or the light emission of the device forming layer 18.

Figure 2:
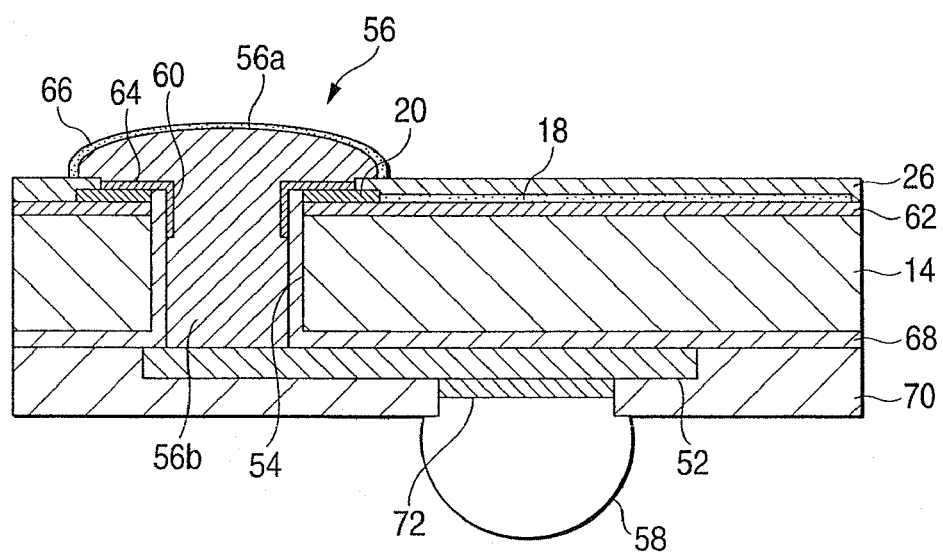
FIG. 2 is a longitudinal sectional view showing a configuration of a through electrode 56 in Embodiment 1 in an enlarged fashion.

Here, a configuration of the through electrode 56 of the semiconductor device 50 will be explained hereunder. FIG. 2 is a longitudinal sectional view showing the configuration of the through electrode 56 in Embodiment 1 in an enlarged fashion. As shown in FIG. 2, the through electrode 56 has a collar-like connection portion 56a connected to the Al electrode pad 20 over its circumference, and a rod-like connection portion 56b formed in the through hole 54 such that one end is coupled integrally to the collar-like connection portion 56a and the other end is extended to the lower surface side of the semiconductor element 14. The Al electrode pad 20 is annularly shaped to have an opening 60 in its center area. Then, the through electrode 56 is formed such that the collar-like connection portion 56a covers an upper surface of the Al electrode pad 20 and the rod-like connection portion 56b is inserted into an opening of the Al electrode pad 20 and the through hole 54. Then, an electrical connection between a surface of the Al electrode pad 20 and the through electrode 56 can be given without fail by the collar-like connection portion 56a and also the collar-like connection portion 56a can protect the Al electrode pad 20. In the present embodiment, an outer diameter of the collar-like connection portion 56a is set to 120 μm and an outer diameter of the rod-like connection portion 56b is set to 60 μm or less. Also, an outer diameter ratio between the collar-like connection portion 56a and the rod-like connection portion 56b is a ratio of 2:1 or less, but this outer diameter ratio can be set to any value.

A lower surface side of the Al electrode pad 20 is provided on the insulating layer ($SiO_2$) 62 of the semiconductor element 14, and a Cr/Cu protection film 64 formed of a Cr layer and a Cu layer for the purpose of giving protection in executing the Cu electroplating is formed on an upper surface side of the Al electrode pad 20. Therefore, the collar-like connection portion 56a is connected to the Al electrode pad 20 via the Cr/Cu protection film 64. In the embodiment, the protection film 64 is formed of the Cr/Cu layers; however, the protective film can be formed of metal material having a conductivity such as Ti, Cr, Ti/Cu, Cr/Au, Ti/Au or the like. Also, a Ni/Au electrode layer 66 formed of a Ni layer and an Au layer is formed on a surface of the collar-like connection portion 56a.

Also, an insulating layer ($SiO_2$ or SiN) 68 is formed on an inner peripheral surface of the through hole 54 and a lower surface of the semiconductor element 14. Also, a solder resist layer 70 is laminated on a lower surface of the insulating layer 68 and a surface of the rewiring pattern 52. The solder bump 58 is connected to the rewiring pattern 52, which is exposed from an opening of the solder resist layer 70, via a Ni/Au electrode layer 72.

As the method of manufacturing the semiconductor device 50, there are the manufacturing methods (a) to (c) described in following, for example. (a) In the first manufacturing method, a plurality of device forming layers 18, the Al electrode pads 20, the passivating layer 26, and the insulating layer 62 constituting respective semiconductor elements 14 are formed on the Si wafer on which a plurality of semiconductor elements 14 are formed. Then, the through electrodes 56 are formed, and then the rewiring step and the solder bump forming step are applied. Finally, respective semiconductor devices 50 are cut off by the dicing step.

(b) In the second manufacturing method, a plurality of device forming layers 18, the Al electrode pads 20, the passivating layer 26, and the insulating layer 62 constituting respective semiconductor elements 14 are formed on the Si wafer on which a plurality of semiconductor elements 14 are formed. Then, respective semiconductor elements 14 are cut off by the dicing step, and then the through electrodes 56 are formed every semiconductor element 14. Finally, the rewiring step and the solder bump forming step are applied.

(c) In the third manufacturing method, respective Si small pieces constituting the semiconductor elements 14 are cut off from the Si wafer by the dicing. Then, the semiconductor element 14 is obtained by forming the device forming layer 18, the Al electrode pads 20, the passivating layer 26, and the insulating layer 62 on this Si small piece, and then the through electrodes 56 are formed every semiconductor element 14. Finally, the rewiring step and the solder bump forming step are applied.

In the present embodiment, explanation will be made hereunder by taking as an example the case where the manufacturing method in (c) is employed.

Next, steps of manufacturing the through electrodes 56 of the semiconductor device 50 will be explained hereunder. The steps of manufacturing the through electrodes 56 are roughly classified into (1) step of forming the opening, (2) step of forming the insulating layer, (3) step of forming the through electrode and step of ensuring an electrical continuity to the electrode pad, and (4) step of rewiring and removing the resist.

(1) Step of Forming the Opening in Embodiment 1

FIG. 3A to FIG. 3E are views explaining steps (#1 to #5) of forming an opening in a method of manufacturing a semiconductor device in Embodiment 1. In steps shown in FIG. 3A, a flat plate silicon material (silicon substrate) used to form the semiconductor elements 14 is prepared. Then, the silicon substrate is separated into the semiconductor elements 14 of a predetermined dimension by the dicing step, for example. The device forming layer 18 is formed on the upper surface of the insulating layer ($SiO_2$) 62 of the semiconductor elements 14, and then the Al electrode pads 20 are formed around the device forming layer 18 by the thin film forming method such as the vapor deposition, or the like. Also, the passivating layer 26 such as SiN, polyimide, or the like is laminated on the surface of the insulating layer 62 and the upper surfaces of the Al electrode pads 20 except its center portion. The upper surface of the Al electrode pad 20 is exposed from an opening 80 in the passivating layer 26. In the present embodiment, a diameter of the opening 80 is set to 120 μm, and a profile of the collar-like connection portion 56a of the through electrode 56 is decided based on a shape of the opening 80.

Figure 3A:
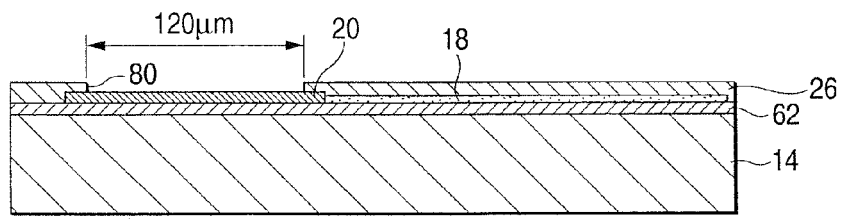
FIG. 3A is a view explaining steps (#1) of forming an opening in a method of manufacturing a semiconductor device in Embodiment 1.
Figure 3B:
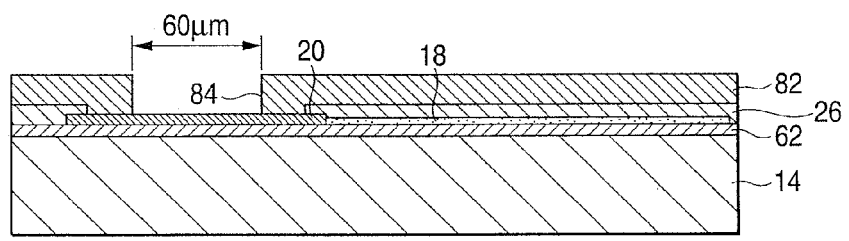
FIG. 3B is a view explaining steps (#2) of forming the opening in the method of manufacturing the semiconductor device in Embodiment 1.

In steps shown in FIG. 3B, a first resist layer 82 is formed by coating the photoresist on a surface of the passivating layer 26. The first resist layer 82 aims at protecting the device forming layer 18 when the dry etching is applied, and is coated thicker than the normal one to render plural times of the dry etching possible.

Then, the exposure/development is applied to the first resist layer 82 via a mask (not shown) having a mask pattern corresponding to the Al electrode pads 20. In case the photoresist is the positive resist, the photoresist coated on center portions of upper surfaces of the Al electrode pads 20 is fused by irradiating a light onto the center portions of the upper surfaces of the Al electrode pads 20. Thus, openings 84 are formed to oppose to the center portions of the upper surfaces of the Al electrode pads 20.

Also, in case the photoresist is the negative resist, the photoresist coated on the center portions of the upper surfaces of the Al electrode pads 20 is fused by irradiating a light onto peripheral portions except the center portions of the upper surfaces of the Al electrode pads 20. Thus, the openings 84 are formed. In the present embodiment, a diameter of the opening 84 is set to 60 µm. Since the through hole 54 communicated with this opening 84 is formed in same diameter, a profile of the rod-like connection portion 56*b* of the through electrode 56 is decided by the opening 84. Also, in this step, since the openings 84 are formed in the first resist layer 82 by irradiating a light from the top side of the semiconductor element 14, an alignment on the lower surface (back surface) of the semiconductor element 14 is not needed.

Figure 3C:
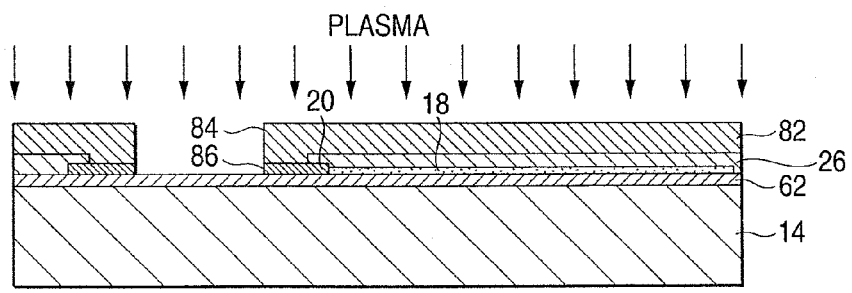
FIG. 3C is a view explaining steps (#3) of forming the opening in the method of manufacturing the semiconductor device in Embodiment 1.

In steps shown in FIG. 3C, openings 86 are provided in center portions of the Al electrode pads 20 by the dry etching. In the dry etching such as the reactive ion etching using a chlorine-based gas as a reaction gas, or the like, positive ions in the plasma are implanted into the center portions of the upper surfaces of the Al electrode pads 20, which are not covered with the first resist layer 82, and thus the center portions of the Al electrode pads 20 are removed from the top in the vertical direction. Accordingly, the Al electrode pad 20 has a hollow shape having the opening 86 in its center portion. Also, since the device forming layer 18 is covered with the first resist layer 82 in the dry etching of the opening 86, the device forming layer 18 is protected from the plasma atmosphere.

Figure 3D:
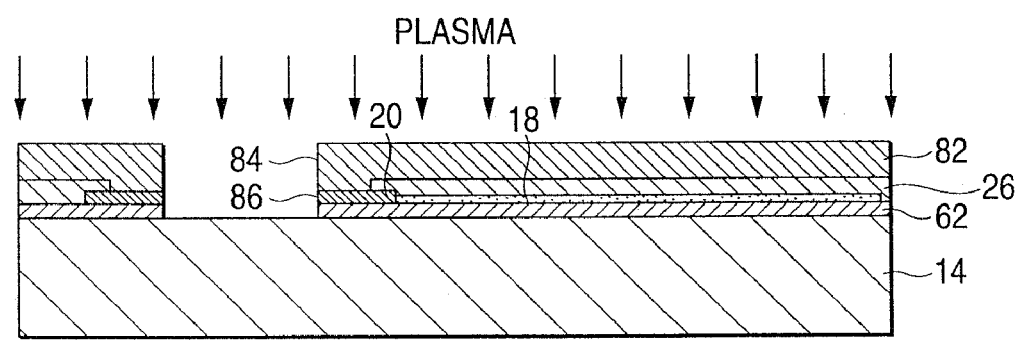
FIG. 3D is a view explaining steps (#4) of forming the opening in the method of manufacturing the semiconductor device in Embodiment 1.

In steps shown in FIG. 3D, portions of the insulating layer 62 formed on the lower side of the Al electrode pads 20, which oppose to the openings 84, 86, are removed from the top side by the dry etching method. For example, the plasma is generated by a reaction gas such as $CHF_3$, $CF_4$, or the like, and then exposed portions of the insulating layer 62 are removed by the etching based on the chemical reaction. At that time, the device forming layer 18 is protected from the plasma atmosphere by the first resist layer 82.

Figure 3E:
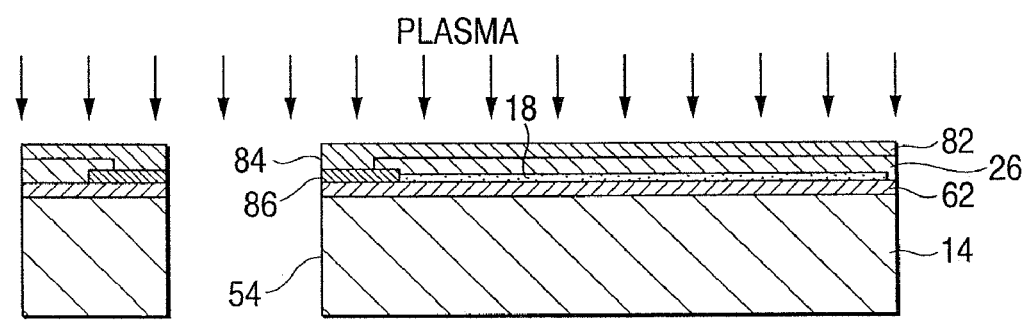
FIG. 3E is a view explaining steps (#5) of forming the opening in the method of manufacturing the semiconductor device in Embodiment 1.

In steps shown in FIG. 3E, portions of the semiconductor element 14, which are communicated with the openings 86, are removed from the top side by the dry etching method, and thus the through holes 54 are passed through up to the bottom surface side of the semiconductor element 14. Accordingly, the openings 84, 86 and the through hole are passed through as one hole. At that time, the device forming layer 18 is protected from the plasma atmosphere by the first resist layer 82. In this case a thickness of the first resist layer 82 is reduced, but the first resist layer 82 can still protect the device forming layer 18 after the etching process since its original thickness is set thick.

In this manner, the through holes 54 can be provided by the dry etching from the top side of the semiconductor element 14 on which the device forming layer 18 is formed. Therefore, the fine through holes 54 having a high aspect ratio can be formed and the device forming layer 18 can be protected from the plasma atmosphere by the first resist layer 82. In addition, since the openings 84, 86 and the through holes 54 can be worked from the upper surface side, an alignment to be applied from the back surface side can be omitted and also the opening forming steps can be easily executed.

(2) Step of Forming the Insulating Layer in Embodiment 1

FIG. 4A to FIG. 4E are views explaining steps (#1 to #5) of forming an insulating layer in a method of manufacturing a semiconductor device in Embodiment 1. In steps shown in FIG. 4A, a protection film 90 is pasted on an upper surface of the first resist layer 82. This protection film 90 protects the device forming layer and closes the openings 84, 86 communicated with the through holes 54 from the upper surface side.

Figure 4A:
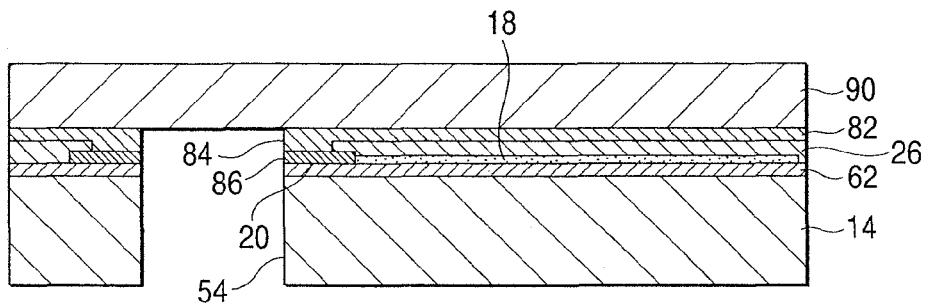
FIG. 4A is a view explaining steps (#1) of forming an insulating layer in a method of manufacturing a semiconductor device in Embodiment 1.
Figure 4B:
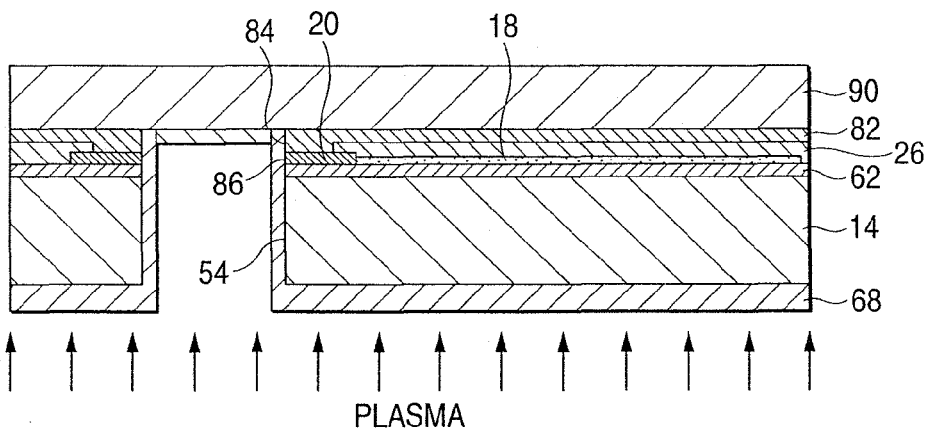
FIG. 4B is a view explaining steps (#2) of forming the insulating layer in the method of manufacturing the semiconductor device in Embodiment 1.

In steps shown in FIG. 4B, the insulating layer 68 is formed from the lower surface side of the semiconductor element 14 by the thin film forming method such as the plasma CVD (Chemical Vapor Deposition), or the like. In order to form this insulating layer 68, the method of forming an oxide film while using TEOS (Tetra Ethyl OrthoSilicate: $Si(OC_2H_3)_4$) and $O_3$ at a temperature of 250° C. or less, for example, is employed. Also, the insulating layer 68 is formed on the lower surface side of the semiconductor element 14, inner peripheral surfaces of the through holes 54, and inner peripheral surfaces of the openings 84, 86. Also, since the upper surface side of the opening 84 is blocked by the protection film 90, the insulating layer 68 is also formed on a lower surface of the protection film 90 that contacts the openings 84.

Figure 4C:
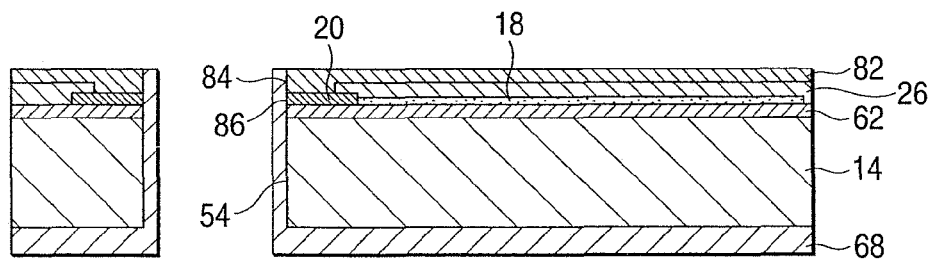
FIG. 4C is a view explaining steps (#3) of forming the insulating layer in the method of manufacturing the semiconductor device in Embodiment 1.

In steps shown in FIG. 4C, the protection film 90 is released. Since this protection film 90 is released while a portion of the insulating layer 68 to close the opening 84 is being stuck to its lower surface, the cylindrical insulating layer 68 for covering the inner peripheral surfaces of the through hole 54 and the opening 84 is formed to pass through from the upper surface side to the lower surface side. Since all steps applied from the dry etching of the through hole 54 and the openings 84, 86 to the formation of the insulating layer 68 are the dry steps, the inner peripheral surfaces of the through hole 54 and the openings 84, 86 are maintained in a clean state. Therefore, the step of cleaning the through hole 54 and the openings 84, 86 can be omitted.

Figure 4D:
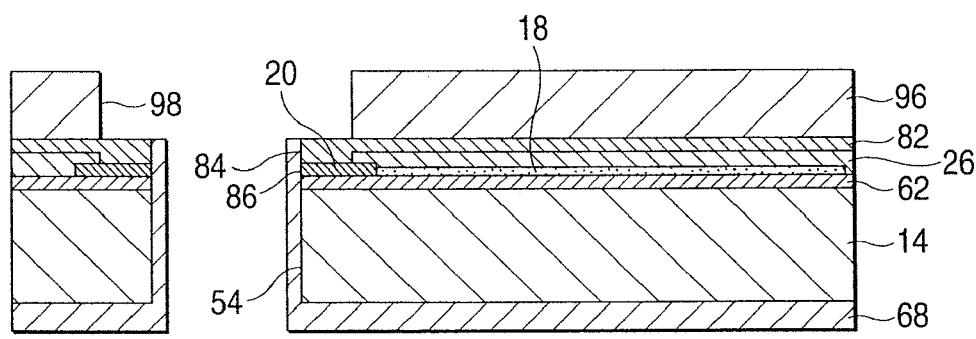
FIG. 4D is a view explaining steps (#4) of forming the insulating layer in the method of manufacturing the semiconductor device in Embodiment 1.

In steps shown in FIG. 4D, a second resist layer 96 is formed by coating the photoresist on a surface of the first resist layer 82 and patterning the photoresist. Then, the second resist layer 96 stacked over the Al electrode pads 20 is partially removed by the patterning (exposure/development), and thus openings 98 are formed.

Figure 4E:
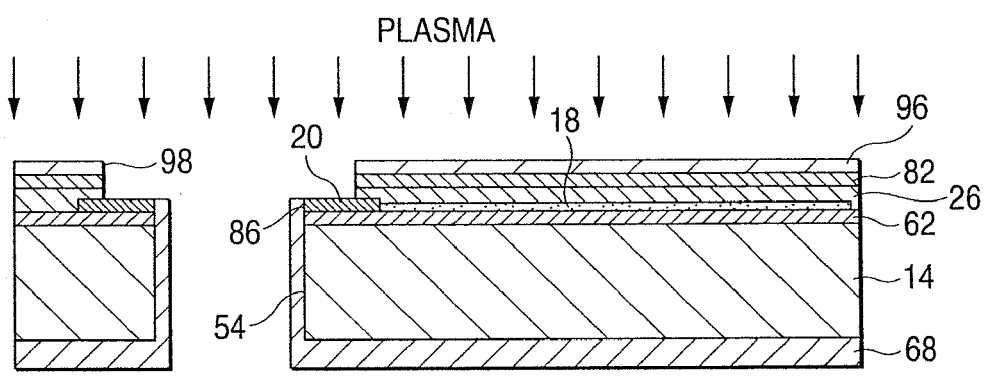
FIG. 4E is a view explaining steps (#5) of forming the insulating layer in the method of manufacturing the semiconductor device in Embodiment 1.

In steps shown in FIG. 4E, portions, which are exposed from the openings 98, of the first resist layer 82 stacked on the surfaces of the Al electrode pads 20 are removed by using the ozone ashing equipment or the plasma ashing equipment. Also, upper end portions, which are projected upward from the Al electrode pads 20, of the cylindrical insulating layers 68 that are formed on the inner peripheral surfaces of the through hole 54 and the openings 84, 86 are removed. Thus, surfaces of the Al electrode pads 20 are exposed. In this case, a thickness of the second resist layer 96 is reduced by the ashing step, but the second resist layer 96 is coated thicker than a normal thickness in view of a reduction in thickness by the ashing.

(3) Step of Forming the through Electrode and Step of Ensuring an Electrical Continuity to the Electrode Pad in Embodiment 1

FIG. 5A to FIG. 5D are views explaining steps (#1 to #4) of forming a through electrode and steps of ensuring an electrical continuity to an electrode pad in a method of manufacturing a semiconductor device in Embodiment 1. In steps shown in FIG. 5A, the Cr/Cu protection film 64 formed of the Cr layer and the Cu layer is formed on the upper surface sides of the Al electrode pads 20 and the inner sides of the openings 86 of the Al electrode pads 20 and the openings 98 by the thin film forming method such as the sputter method.

If a plating solution comes directly into contact with the Al electrode pads 20 when the through electrodes 56 are formed by the Cu plating based on the electroplating method, surfaces of the Al electrode pads 20 are corroded. For this reason, the surfaces of the Al electrode pads 20 are covered with the Cr/Cu protection film 64 to protect the Al electrode pads 20.

Also, because the Cr/Cu protection film 64 is formed on the surfaces of the Al electrode pads 20, direct connection between Al and Cu can be avoided. Thus, mutual diffusion can be prevented and also electrical continuity and adhesiveness between the through electrodes 56 which is subjected to the Cu plating and the Al electrode pads 20, can be ensured.

Figure 5A:
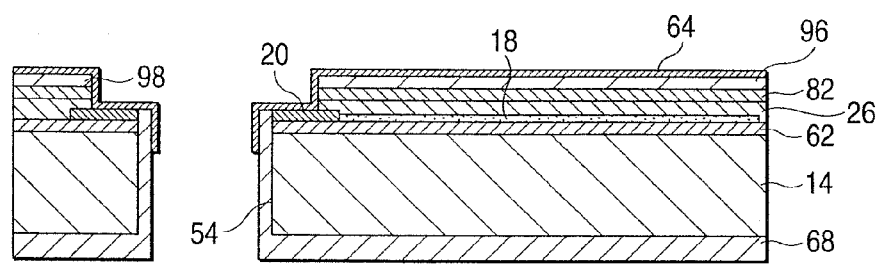
FIG. 5A is a view explaining steps (#1) of forming a through electrode and steps of ensuring an electrical continuity to an electrode pad in a method of manufacturing a semiconductor device in Embodiment 1.
Figure 5B:
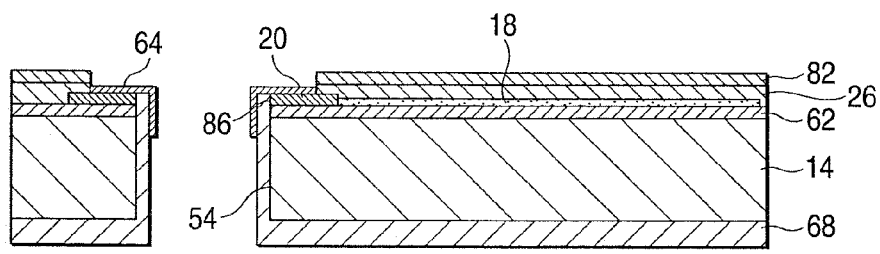
FIG. 5B is a view explaining steps (#2) of forming the through electrode and steps of ensuring the electrical continuity to the electrode pad in the method of manufacturing the semiconductor device in Embodiment 1.

In steps shown in FIG. 5B, the second resist layer 96 is released by the lift-off method and thus a portion of the Cr/Cu protection film 64, which is stacked on a surface of the second resist layer 96, is removed. Accordingly, because the lift-off method is employed, the Cr/Cu protection film 64 can be easily left only on the Al electrode pads 20 and upper areas of the inner walls of the insulating layers 68 formed on the inner side of the openings 86 of the Al electrode pads 20. Here, the first resist layer 82 is exposed on the surface after the second resist layer 96 is removed.

Figure 5C:
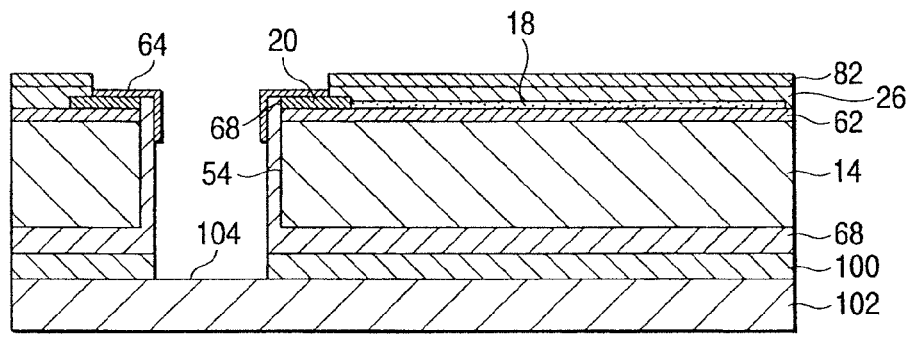
FIG. 5C is a view explaining steps (#3) of forming the through electrode and steps of ensuring the electrical continuity to the electrode pad in the method of manufacturing the semiconductor device in Embodiment 1.

In steps shown in FIG. 5C, a Cu power feeding layer 102 is adhered onto the lower surface of the insulating layer 68 by utilizing a tackiness of an adhesive layer 100 such as an adhesive film, or the like. The Cu power feeding layer 102 acts as the plating electrode in applying the electroplating. Then, openings 104 are formed in portions of the adhesive layer 100, which close the lower portions of the through holes 54, by the exposure/development. Accordingly, a surface of the Cu power feeding layer 102 is communicated with the through holes 54 via the openings 104.

Figure 5D:
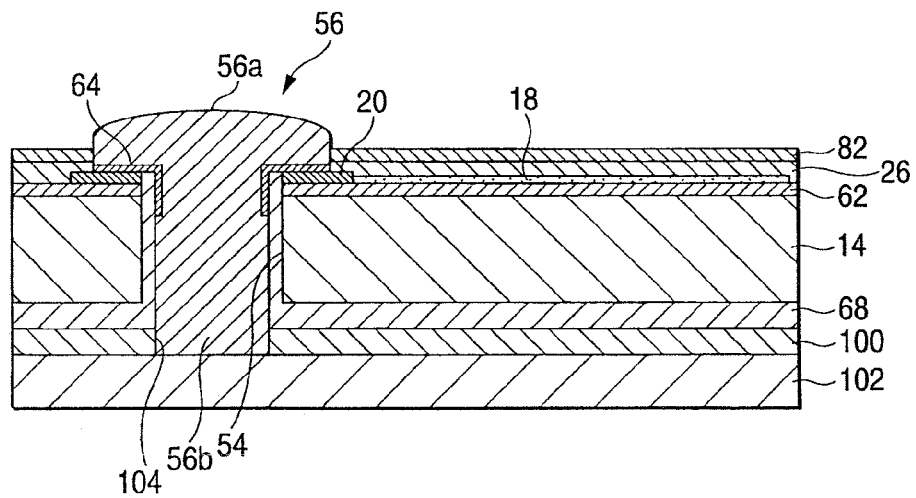
FIG. 5D is a view explaining steps (#4) of forming the through electrode and steps of ensuring the electrical continuity to the electrode pad in the method of manufacturing the semiconductor device in Embodiment 1.

In steps shown in FIG. 5D, Cu is deposited on the surface of the Cu power feeding layer 102 communicated with the through holes 54 by the electroplating method. Thus, the through electrodes 56 are grown upwardly in the through holes 54 by the Cu deposited on the Cu power feeding layer 102. In this manner, a void (cavity) is hard to generate in the through electrodes 56 because the Cu is deposited upwardly from the bottom.

Then, when the Cu deposited by the electroplating method reaches upper areas of the through holes 54, the upper portions of the rod-like connection portions 56b contact tightly the Cr/Cu protection films 64. Also, when the Cu is further deposited on the upper surfaces of the Cr/Cu protection films 64 formed on the surfaces of the Al electrode pads 20 by the Cu plating, the collar-like connection portions 56a are formed. Since the surfaces of the Al electrode pads 20 are covered with the Cr/Cu protection film 64, the surfaces of the Al electrode pads 20 are protected from the direct touch to the plating solution.

In this manner, since the through electrode 56 is formed to have the rod-like connection portions 56b filled in the through hole 54, and the collar-like connection portion 56a extended from the top portion of the rod-like connection portions 56b in the radial direction to cover the surface of the Al electrode pad 20, the electrical continuity to the Al electrode pad 20 via the Cr/Cu protection films 64 can be ensured. The device forming layer 18 is protected by the first resist layer 82 during the electroplating.

(4) Step of Rewiring and Removing the Resist in Embodiment 1

FIG. 6A to FIG. 6E are views explaining steps (#1 to #5) of rewiring and removing a resist in a method of manufacturing a semiconductor device in Embodiment 1. In steps shown in FIG. 6A, the planalizing process is applied to the lower surface (back surface) of the semiconductor element 14. In this planalizing process, the adhesive layer 100 is released after the Cu power feeding layer 102 is removed, and then the lower surface of the insulating layer 68 is planalized by the polishing.

Figure 6A:
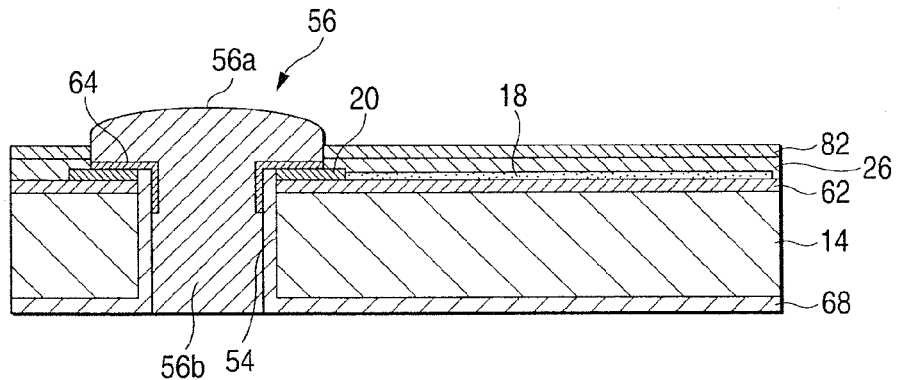
FIG. 6A is a view explaining steps (#1) of rewiring and removing a resist in a method of manufacturing a semiconductor device in Embodiment 1.
Figure 6B:
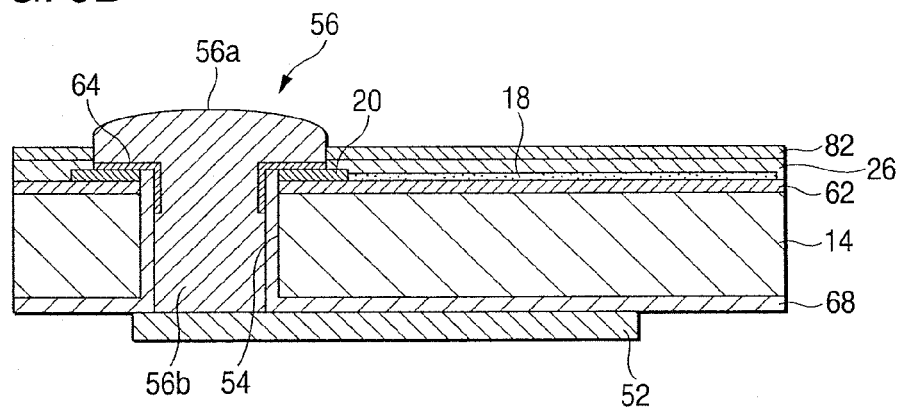
FIG. 6B is a view explaining steps (#2) of rewiring and removing the resist in the method of manufacturing the semiconductor device in Embodiment 1.

In steps shown in FIG. 6B, a metal film is formed on the lower surface side (back surface side) of the semiconductor element 14 by the Cu sputter method, or the like, and then the rewiring patterns 52 are formed by etching the metal film. As the method of forming the rewiring patterns 52, for example, the semi-additive method is employed and this semi-additive method are executed according to following procedures (a) to (e). (a) The Cr/Cu layer is formed on the lower surface of the insulating layer 68 by the sputter method. (b) The openings corresponding to shapes of the rewiring patterns 52 are formed by patterning the resist layer to expose the Cr/Cu layer. (c) The Cu layer is formed on the surface of the Cr/Cu layer by the Cu electroplating method. (d) The resist layer is released. (e) The extra Cr/Cu layer is removed. In this way, the rewiring patterns 52 of a predetermined shape are left on the lower surface of the insulating layer 68.

Figure 6C:
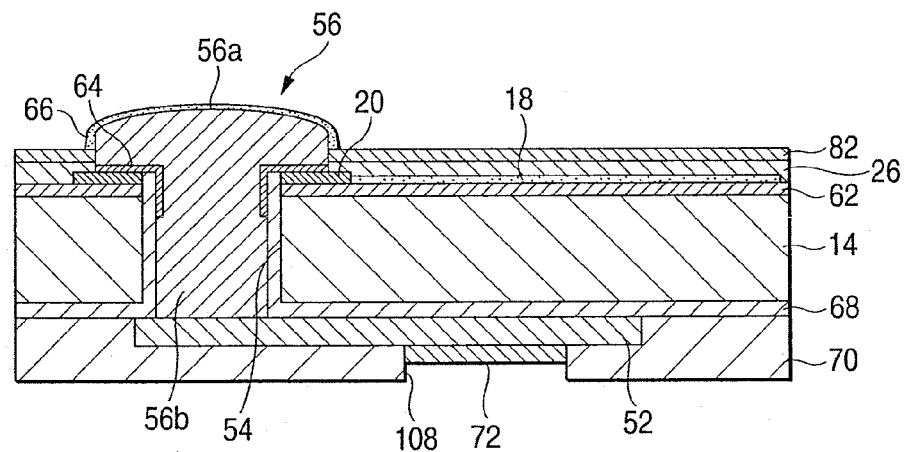
FIG. 6C is a view explaining steps (#3) of rewiring and removing the resist in the method of manufacturing the semiconductor device in Embodiment 1.
Figure 6D:
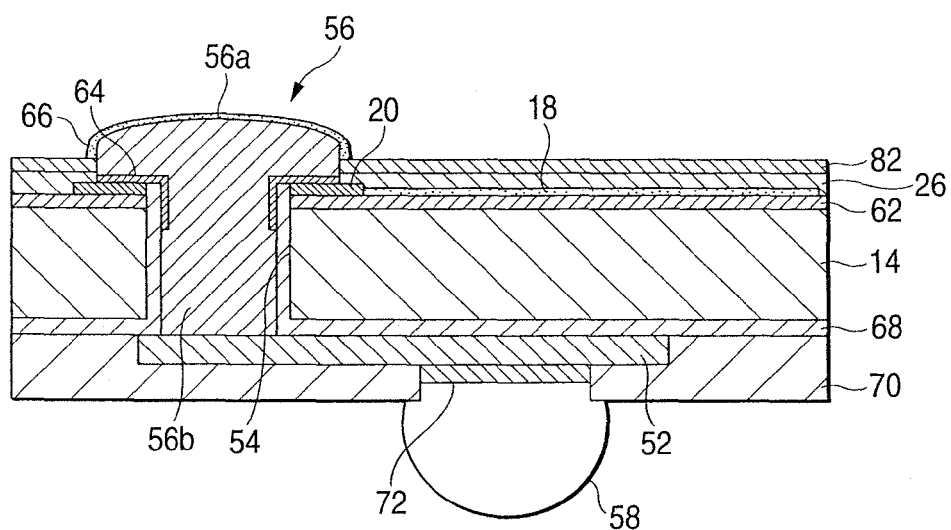
FIG. 6D is a view explaining steps (#4) of rewiring and removing the resist in the method of manufacturing the semiconductor device in Embodiment 1.

In steps shown in FIG. 6C, the solder resist layer 70 is formed on the lower surface of the insulating layer 68 openings 108 communicated with the rewiring patterns 52 are formed by removing portions, which oppose to the rewiring patterns 52, of the solder resist layer 70. Then, the Ni/Au electrode layers 66, 72 formed of the Ni layer and the Au layer are formed on the surfaces of the rewiring patterns 52, which are exposed from the openings 108 on the lower surface side (back surface side) of the semiconductor element 14, and surfaces of the collar-like connection portions 56a, which are exposed on the upper surface side (front surface side) of the semiconductor element 14, by the electroless plating method In steps shown in FIG. 6D, the solder bumps 58 are mounted on the Ni/Au electrode layers 72 formed on the lower surface side (back surface side) of the semiconductor element 14.

Figure 6E:
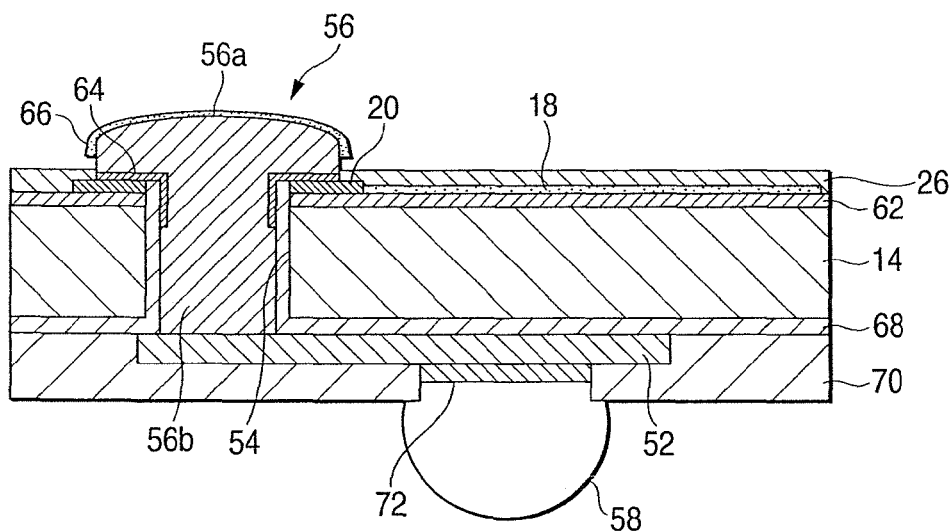
FIG. 6E is a view explaining steps (#5) of rewiring and removing the resist in the method of manufacturing the semiconductor device in Embodiment 1.

In steps shown in FIG. 6E, the first resist layer 82 left on the upper surface side (front surface side) of the semiconductor element 14 is removed. Thus, the semiconductor device 50 is completed. In this manner, the first resist layer 82 for protecting the device forming layer 18 is formed at first and removed in the last step. Therefore, the device forming layer 18 can be protected until respective steps of (1) step of forming the opening, (2) step of forming the insulating layer, (3) step of forming the through electrode and step of ensuring an electrical continuity to the electrode pad, and (4) step of rewiring and removing the resist are finished.

Embodiment 2

Next, steps of manufacturing the through electrodes 56 in Embodiment 2 will be explained hereunder. In Embodiment 2, the same reference symbols are affixed to the same portions as those in Embodiment 1.

(1) Step of Forming the Opening in Embodiment 2

FIG. 7A to FIG. 7F are views explaining steps (#1 to #6) of forming an opening in a method of manufacturing a semiconductor device in Embodiment 2. In steps shown in FIG. 7A, the flat plate silicon material (silicon substrate) used to form the semiconductor elements 14 is prepared. Then, the silicon substrate is separated into the semiconductor elements 14 of a predetermined dimension by the dicing step, for example. The device forming layer 18 is formed on the upper surface of the insulating layer ($SiO_2$) 62 of the semiconductor elements 14, and then the Al electrode pads 20 are formed around the device forming layer 18 by the thin film forming method such as the vapor deposition, or the like. Also, the passivating layer 26 such as SiN, polyimide, or the like is laminated on the surface of the insulating layer 62 and the upper surfaces of the Al electrode pads 20 except its center portion. The upper surface of the Al electrode pad 20 is exposed from an opening 80 in the passivating layer 26. In the present embodiment, a diameter of the opening 80 is set to 120 μm, and a profile of the collar-like connection portion 56a of the through electrode 56 is decided based on a shape of the opening 80.

Figure 7A:
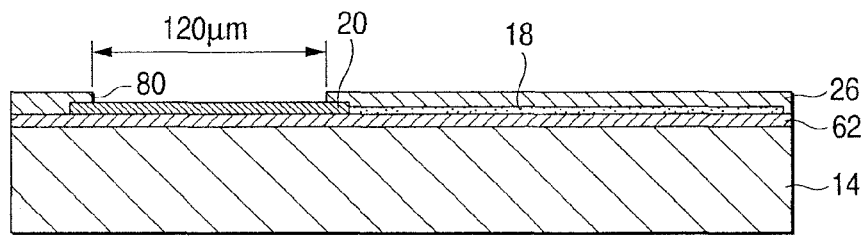
FIG. 7A is a view explaining steps (#1) of forming an opening in a method of manufacturing a semiconductor device in Embodiment 2.
Figure 7B:
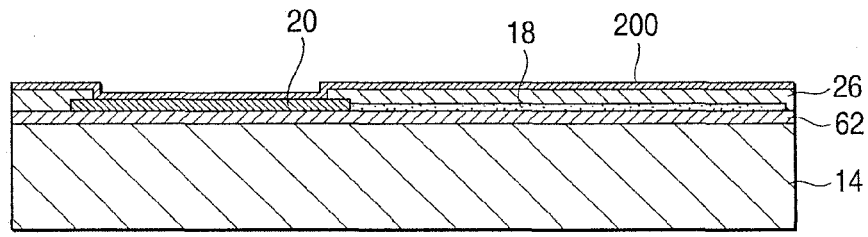
FIG. 7B is a view explaining steps (#2) of forming the opening in the method of manufacturing the semiconductor device in Embodiment 2.

In steps shown in FIG. 7B, a metal layer 200 for protecting the device forming layer 18 from the plasma atmosphere is formed on the surfaces of the Al electrode pads 20 and the surface of the passivating layer 26 by the thin film forming method such as the sputter method, or the like. Since the metal layer 200 is formed on the overall surface on the upper surface side, the whole surface of the semiconductor element 14 is set to the same potential, so that an electrostatic breakdown of the device forming layer 18 can be prevented. Further, all of Al electrode pads 20 are set to the same potential at the plasma atmosphere in the dry etching, so that the specific Al electrode pad can be prevented from being charged up. In this case, as the metal layer 200 to which the sputter is applied, for example, the metal material having a conductivity such as Ti, Cr, Cr/Cu, Ti/Cu, Cr/Au, Ti/Au or the like can be employed. Also, the Al electrode pads 20 are corrodible, but moisture resistance can be enhanced and corrosion resistance can be improved because the Al electrode pads 20 are covered with the metal layer 200.

Figure 7C:
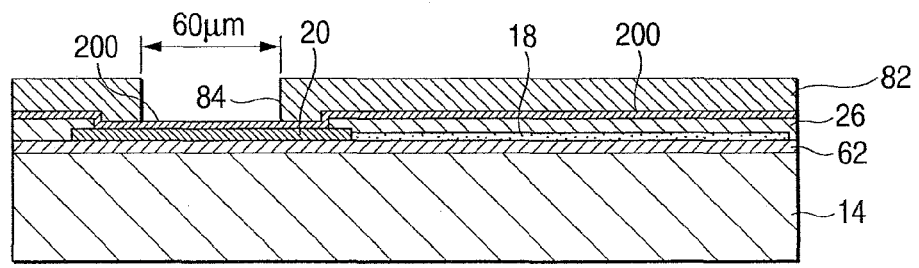
FIG. 7C is a view explaining steps (#3) of forming the opening in the method of manufacturing the semiconductor device in Embodiment 2.

In steps shown in FIG. 7C, the first resist layer 82 is formed by coating the photoresist. The first resist layer 82 aims at protecting the device forming layer 18 when the dry etching is applied, and is coated thicker than the normal one to render plural times of the dry etching possible.

Then, the exposure/development is applied to the first resist layer 82 via the mask (not shown) having the mask pattern corresponding to the Al electrode pads 20. Thus, the openings 84 opposing to the center portions of the upper surfaces of the Al electrode pads 20 are formed by fusing the photoresist coated on center portions of upper surfaces of the Al electrode pads 20. In the present embodiment, the diameter of the opening 84 is set to 60 μm. Since the through hole 54 communicated with this opening 84 is formed in same diameter, a profile of the rod-like connection portion 56b of the through electrode 56 is decided by the opening 84. Also, in this step, since the openings 84 are formed in the first resist layer 82 by irradiating a light from the top side of the semiconductor element 14, an alignment on the lower surface (back surface) of the semiconductor element 14 is not needed.

Figure 7D:
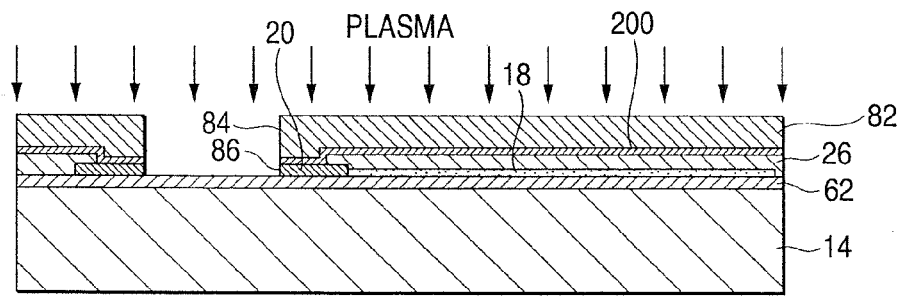
FIG. 7D is a view explaining steps (#4) of forming the opening in the method of manufacturing the semiconductor device in Embodiment 2.

In steps shown in FIG. 7D, the openings 86 are provided in portions, which oppose to the openings 84, of the metal layer 200 of the center portions of the Al electrode pads 20 by the dry etching. In the dry etching such as the reactive ion etching (RIE) using a chlorine-based gas as a reaction gas, or the like, the positive ions in the plasma are injected into the metal layer 200 and the center portions of the upper surfaces of the Al electrode pads 20, which are not covered with the first resist layer 82, and thus the center portions of the Al electrode pads 20 are removed from the top in the vertical direction.

Accordingly, the Al electrode pad 20 has a hollow shape having the opening 86 in its center portion. Also, since the device forming layer 18 is covered with the first resist layer 82 when the openings 86 are removed by the dry etching, it is not possible that the device forming layer 18 is damaged by the plasma atmosphere. Here, the openings 86 may be formed by the wet etching. When this wet etching is employed, the device forming layer 18 is protected by the first resist layer 82 and the metal layer 200 not to contact the etching solution.

Figure 7E:
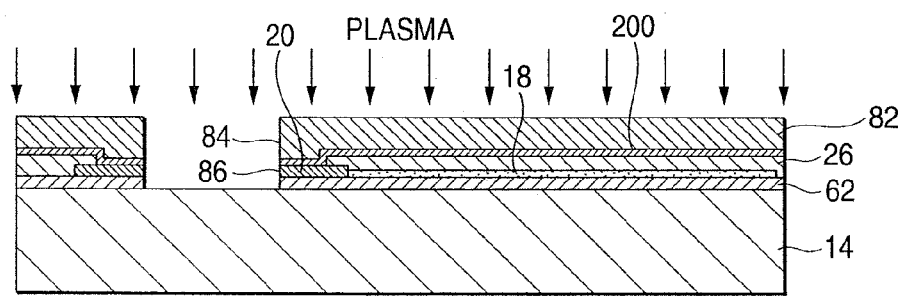
FIG. 7E is a view explaining steps (#5) of forming the opening in the method of manufacturing the semiconductor device in Embodiment 2.

In steps shown in FIG. 7E, the portions of the insulating layer 62 formed on the lower side of the Al electrode pads 20, which oppose to the openings 84, 86, are removed from the top side by the dry etching method. For example, the plasma is generated by a reaction gas such as $CHF_3$, $CF_4$, or the like, and then exposed portions of the insulating layer 62 are removed by the etching based on the chemical reaction. At that time, the device forming layer 18 is protected from the plasma atmosphere by the first resist layer 82.

Figure 7F:
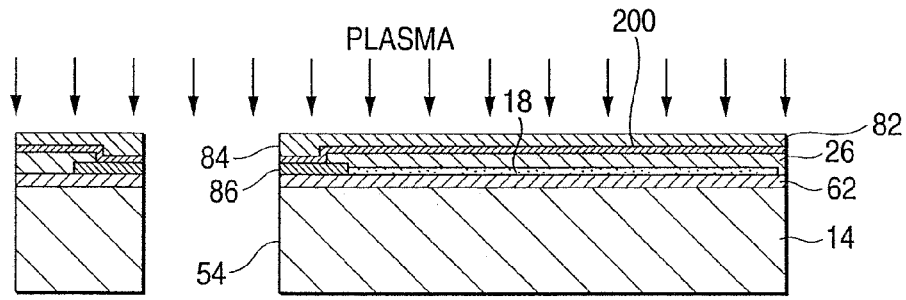
FIG. 7F is a view explaining steps (#6) of forming the opening in the method of manufacturing the semiconductor device in Embodiment 2.

In steps shown in FIG. 7F, portions of the semiconductor element 14, which are communicated with the openings 86, are removed from the top side by the dry etching method, and thus the through holes 54 are passed through up to the bottom surface side of the semiconductor element 14. Accordingly, the openings 84, 86 and the through hole are passed through as one hole. At that time, the device forming layer 18 is protected from the plasma atmosphere by the first resist layer 82. In this case a thickness of the first resist layer 82 is reduced, but the first resist layer 82 can still protect the device forming layer 18 after the etching process since its original thickness is set thick.

In this manner, the through holes 54 can be provided by the dry etching from the top side of the semiconductor element 14 on which the device forming layer 18 is formed. Therefore, the fine through holes 54 having a high aspect ratio can be formed and the device forming layer 18 can be protected from the plasma atmosphere by the first resist layer 82. In addition, since the openings 84, 86 and the through holes 54 can be worked from the upper surface side, an alignment to be applied from the back surface side can be omitted and also the opening forming steps can be easily executed.

(2) Step of Forming the Insulating Layer in Embodiment 2

FIG. 8A to FIG. 8F are views explaining steps (#1 to #6) of forming an insulating layer in a method of manufacturing a semiconductor device in Embodiment 2. In steps shown in FIG. 8A, the protection film 90 is pasted on an upper surface of the first resist layer 82. This protection film 90 protects the device forming layer and closes the openings 84, 86 communicated with the through holes 54 from the upper surface side.

Figure 8A:
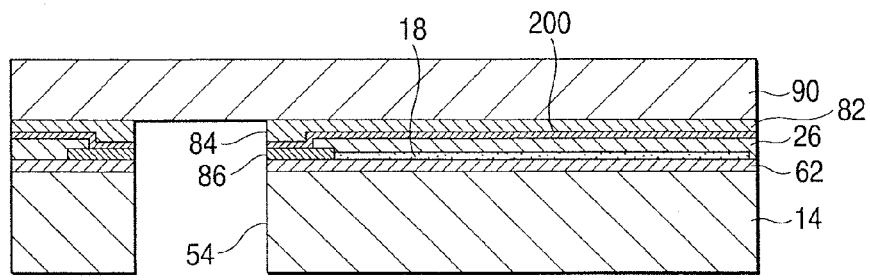
FIG. 8A is a view explaining steps (#1) of forming an insulating layer in a method of manufacturing a semiconductor device in Embodiment 2.
Figure 8B:
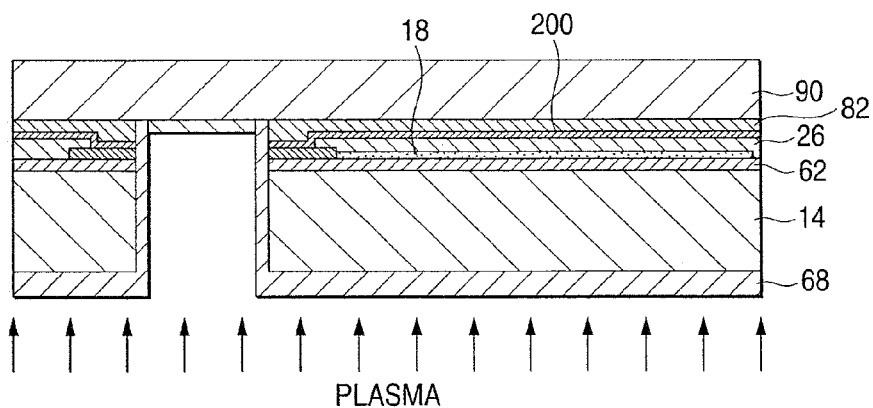
FIG. 8B is a view explaining steps (#2) of forming the insulating layer in the method of manufacturing the semiconductor device in Embodiment 2.

In steps shown in FIG. 8B, the insulating layer 68 is formed from the lower surface side of the semiconductor element 14 by the thin film forming method such as the plasma CVD (Chemical Vapor Deposition), or the like. In order to form this insulating layer 68, the method of forming an oxide film while using TEOS (Tetra Ethyl OrthoSilicate: $Si(OC_2H_3)_4$) and $O_3$ at a temperature of 250° C. or less, for example, is employed. Also, the insulating layer 68 is formed on the lower surface side of the semiconductor element 14, inner peripheral surfaces of the through holes 54, and inner peripheral surfaces of the openings 84, 86. Also, since the upper surface side of the opening 84 is blocked by the protection film 90, the insulating layer 68 is also formed on a lower surface of the protection film 90 that contacts the openings 84.

Figure 8C:
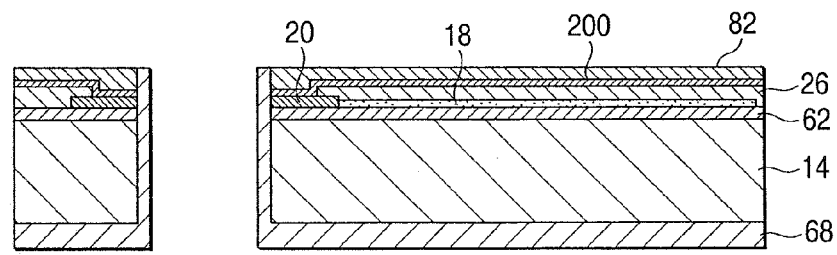
FIG. 8C is a view explaining steps (#3) of forming the insulating layer in the method of manufacturing the semiconductor device in Embodiment 2.

In steps shown in FIG. 8C, the protection film 90 is released. Since this protection film 90 is released while a portion of the insulating layer 68 to close the opening 84 is being stuck to its lower surface, the cylindrical insulating layer 68 for covering the inner peripheral surfaces of the through hole 54 and the opening 84 is formed to pass through from the upper surface side to the lower surface side. Since all steps applied from the dry etching of the through hole 54 and the openings 84, 86 to the formation of the insulating layer 68 are the dry steps, the inner peripheral surfaces of the through hole 54 and the openings 84, 86 are maintained in a clean state. Therefore, the step of cleaning the through hole 54 and the openings 84, 86 can be omitted.

Figure 8D:
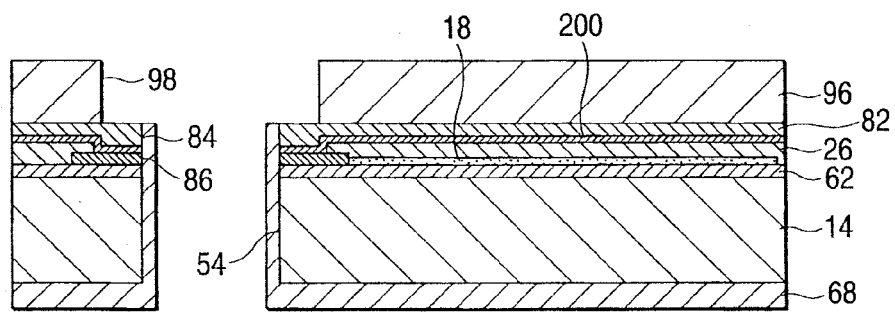
FIG. 8D is a view explaining steps (#4) of forming the insulating layer in the method of manufacturing the semiconductor device in Embodiment 2.

In steps shown in FIG. 8D, the second resist layer 96 is formed by coating the photoresist on a surface of the first resist layer 82 and patterning the photoresist. Then, the second resist layer 96 stacked over the Al electrode pads 20 is partially removed by the patterning (exposure/development), and thus openings 98 are formed.

Figure 8E:
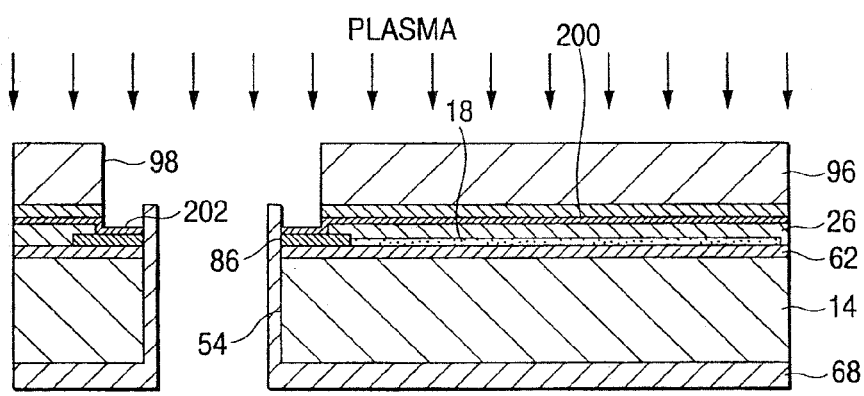
FIG. 8E is a view explaining steps (#5) of forming the insulating layer in the method of manufacturing the semiconductor device in Embodiment 2.

In steps shown in FIG. 8E, the portions, which are exposed from the openings 98, of the first resist layer 82 stacked on the surfaces of the Al electrode pads 20 are removed by using the ozone ashing equipment or the plasma ashing equipment. Thus, annular recess portions 202 to expose the metal layer 200 formed on the surfaces of the Al electrode pads 20 are formed. In this case, a thickness of the second resist layer 96 is reduced by the ashing step, but the second resist layer 96 is coated thicker than a normal thickness in view of a reduction in thickness by the ashing. Also, the Al electrode pad 20 is protected from the plasma atmosphere of the ashing step by the metal layer 200.

Figure 8F:
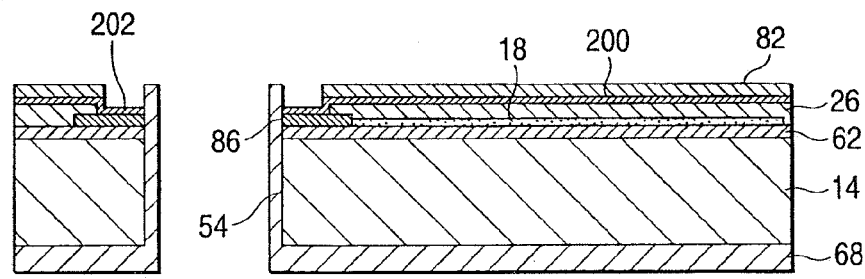
FIG. 8F is a view explaining steps (#6) of forming the insulating layer in the method of manufacturing the semiconductor device in Embodiment 2.

In steps shown in FIG. 8F, the second resist layer 96 is removed by the wet etching method. Accordingly, the first resist layer 82 is exposed. Because the wet etching method is employed, the second resist layer 96 can be removed not to damage the passivating layer 26 formed under the first resist layer 82.

(3) Step of Forming the through Electrode and Step of Ensuring an Electrical Continuity to the Electrode Pad in Embodiment 2

FIG. 9A to FIG. 9D are views explaining steps (#1 to #4) of forming a through electrode and steps of ensuring an electrical continuity to an electrode pad in a method of manufacturing a semiconductor device in Embodiment 2. In steps shown in FIG. 9A, the Cu power feeding layer 102 is adhered onto the lower surface of the insulating layer 68 by utilizing a tackiness of the adhesive layer 100 such as the adhesive film, or the like. The Cu power feeding layer 102 acts as the plating electrode in applying the electroplating.

Figure 9A:
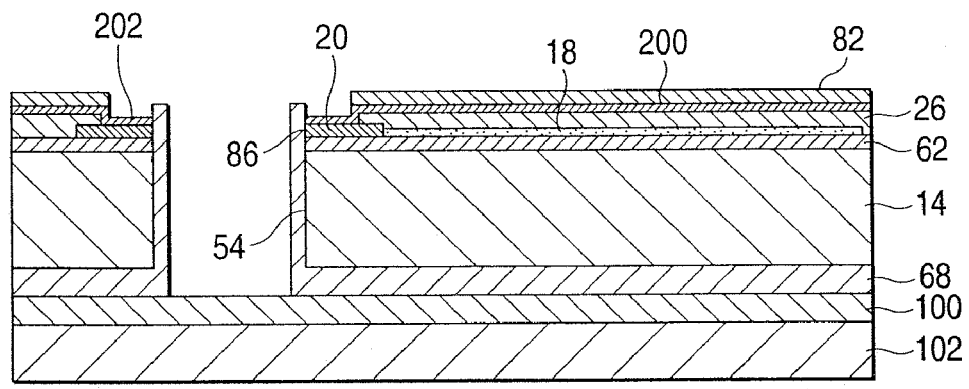
FIG. 9A is a view explaining steps (#1) of forming a through electrode and steps of ensuring an electrical continuity to an electrode pad in a method of manufacturing a semiconductor device in Embodiment 2.
Figure 9B:
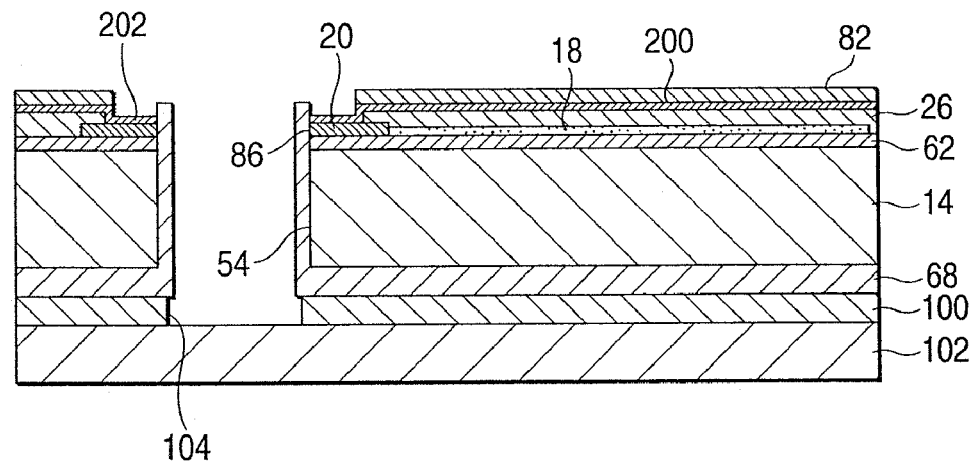
FIG. 9B is a view explaining steps (#2) of forming the through electrode and steps of ensuring the electrical continuity to the electrode pad in the method of manufacturing the semiconductor device in Embodiment 2.

In steps shown in FIG. 9B, the openings 104 are formed in portions of the adhesive layer 100, which close the lower portions of the through holes 54, by the exposure/development. Accordingly, the surface of the Cu power feeding layer 102 is communicated with the through holes 54 via the openings 104.

Figure 9C:
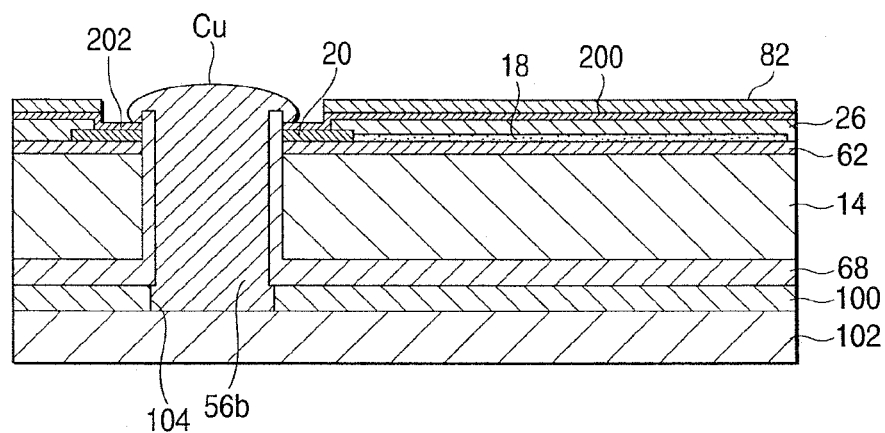
FIG. 9C is a view explaining steps (#3) of forming the through electrode and steps of ensuring the electrical continuity to the electrode pad in the method of manufacturing the semiconductor device in Embodiment 2.

In steps shown in FIG. 9C, the Cu is deposited on the surface of the Cu power feeding layer 102 communicated with the through holes 54 by the electroplating method. Thus, the through electrodes 56 are grown upwardly in the through holes 54 by the Cu deposited on the Cu power feeding layer 102. In this manner, a void (cavity) is hard to generate in the through electrodes 56 because the Cu is deposited upwardly from the bottom.

Then, when the Cu deposited by the electroplating method reaches upper areas of the through holes 54, the Cu plating is extended to the annular recess portion 202 on the outer peripheral side of the insulating layer 68 to get over the upper end on the outer peripheral side of the cylindrical insulating layer 68. Since the surfaces of the Al electrode pads 20 are covered with the metal layer 200, these surfaces are protected from the direct touch to the plating solution.

Figure 9D:
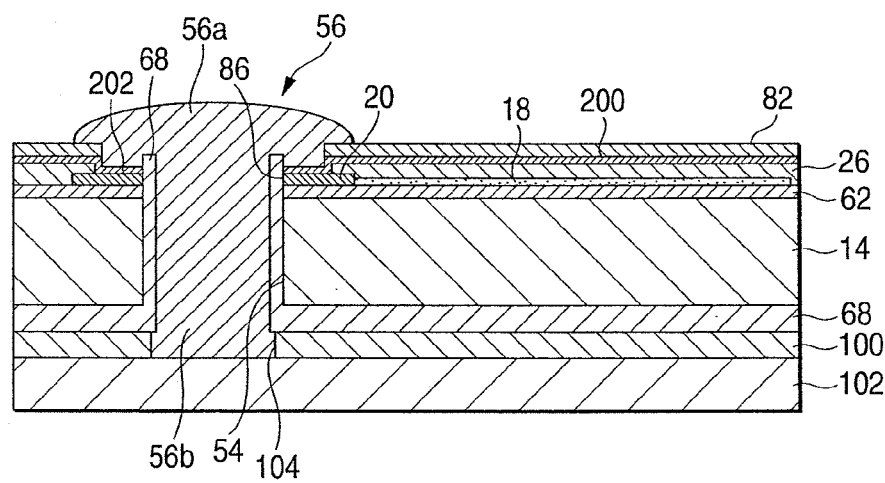
FIG. 9D is a view explaining steps (#4) of forming the through electrode and steps of ensuring the electrical continuity to the electrode pad in the method of manufacturing the semiconductor device in Embodiment 2.

In steps shown in FIG. 9D, since the Cu plating layer is deposited on the annular recess portion 202, the collar-like connection portion 56a is formed on the upper surface of the metal layer 200 formed on the surface of the Al electrode pad 20 to adhere tightly. Therefore, the metal layer 200 has functions of protecting the Al electrode pad 20 from the exposure not to corrode the pad surface and also ensuring the electrical continuity more surely by the adhesiveness to the Cu plating layer.

In this manner, since the through electrode 56 is formed to have the rod-like connection portions 56b filled in the through hole 54, and the collar-like connection portion 56a extended from the top portion of the rod-like connection portions 56b in the radial direction to cover the surface of the metal layer 200, the electrical continuity to the Al electrode pad 20 via the metal layer 200 can be ensured. The device forming layer 18 is protected by the first resist layer 82 during the electroplating.

(4) Step of Rewiring and Removing the Resist in Embodiment 2

FIG. 10A to FIG. 10F are views explaining steps (#1 to #6) of rewiring and removing a resist in a method of manufacturing a semiconductor device in Embodiment 2. In steps shown in FIG. 10A, the planalizing process is applied to the lower surface (back surface) of the semiconductor element 14. In this planalizing process, the adhesive layer 100 is released after the Cu power feeding layer 102 is removed, and then the lower surface of the insulating layer 68 is planalized by the polishing.

Figure 10A:
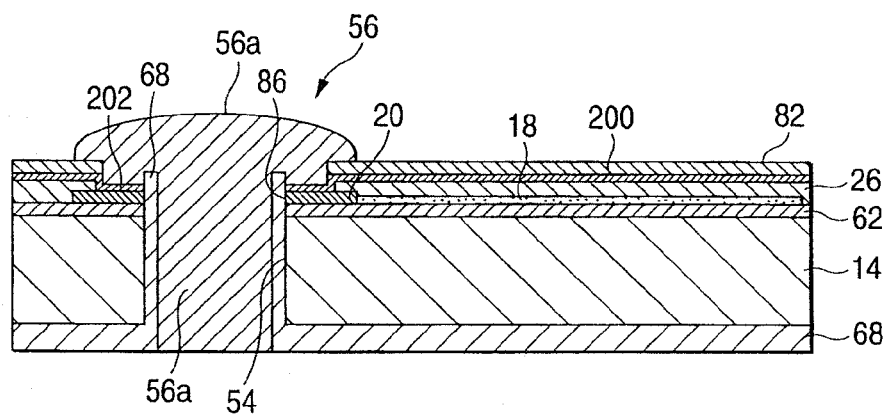
FIG. 10A is a view explaining steps (#1) of rewiring and removing a resist in a method of manufacturing a semiconductor device in Embodiment 2.
Figure 10B:
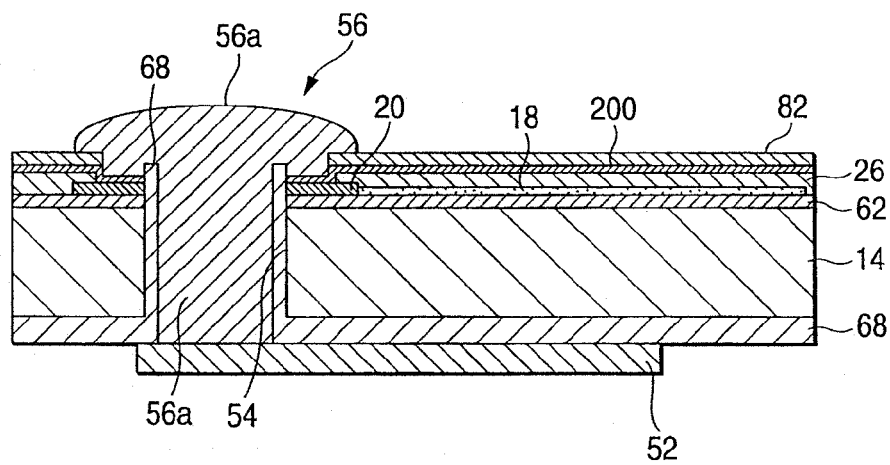
FIG. 10B is a view explaining steps (#2) of rewiring and removing the resist in the method of manufacturing the semiconductor device in Embodiment 2.

In steps shown in FIG. 10B, the metal film is formed on the lower surface side (back surface side) of the semiconductor element 14 by the Cu sputter method, or the like, and then the rewiring patterns 52 are formed by etching the metal film. As the method of forming the rewiring patterns 52, for example, the semi-additive method is employed and this semi-additive method are executed according to following procedures (a) to (e). (a) The Cr/Cu layer is formed on the lower surface of the insulating layer 68 by the sputter method. (b) The openings corresponding to shapes of the rewiring patterns 52 are formed by patterning the resist layer to expose the Cr/Cu layer. (c) The Cu layer is formed on the surface of the Cr/Cu layer by the Cu electroplating method. (d) The resist layer is released. (e) The extra Cr/Cu layer is removed. In this way, the rewiring patterns 52 of a predetermined shape are left on the lower surface of the insulating layer 68.

Figure 10C:
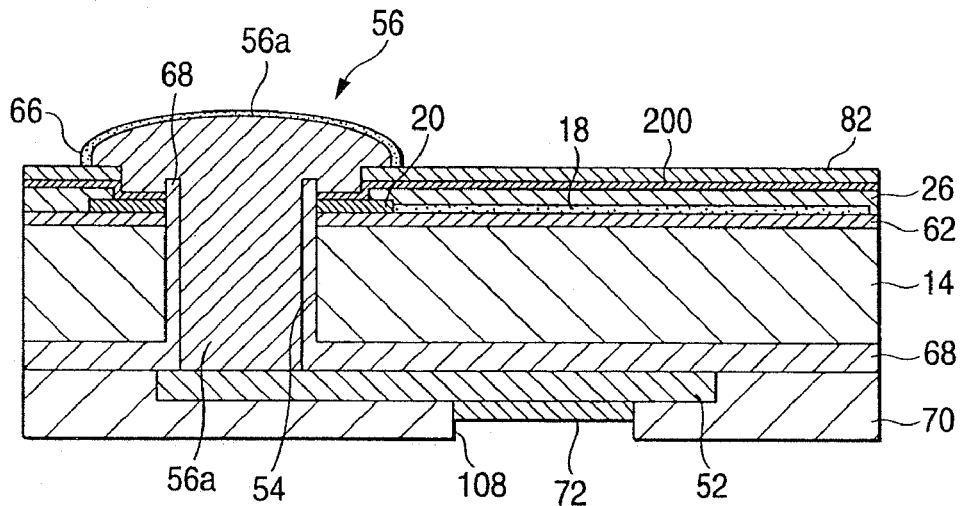
FIG. 10C is a view explaining steps (#3) of rewiring and removing the resist in the method of manufacturing the semiconductor device in Embodiment 2.
Figure 10D:
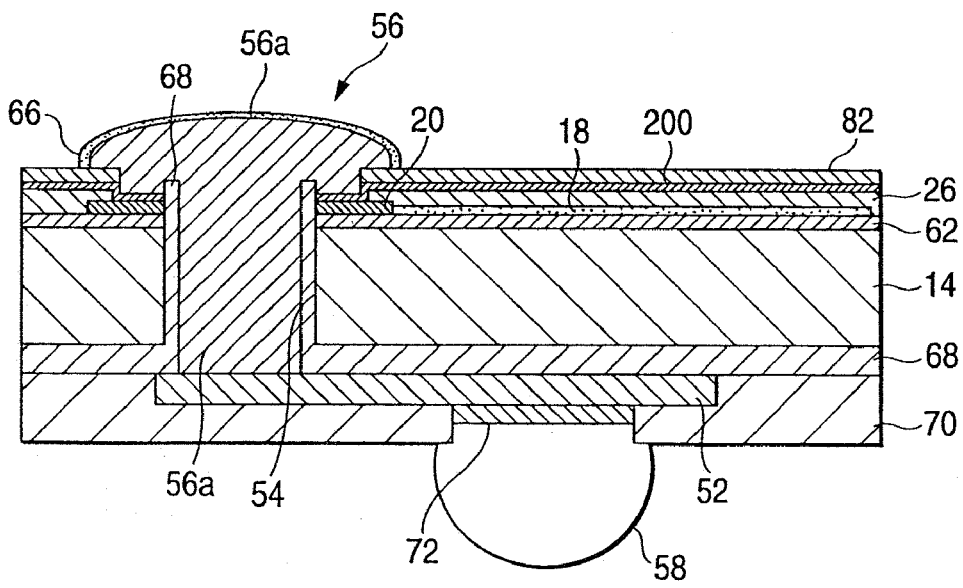
FIG. 10D is a view explaining steps (#4) of rewiring and removing the resist in the method of manufacturing the semiconductor device in Embodiment 2.

In steps shown in FIG. 10C, the solder resist layer 70 is formed on the lower surface of the insulating layer 68 openings 108 communicated with the rewiring patterns 52 are formed by removing portions, which oppose to the rewiring patterns 52, of the solder resist layer 70. Then, the Ni/Au electrode layers 66, 72 formed of the Ni layer and the Au layer are formed on the surfaces of the rewiring patterns 52, which are exposed from the openings 108 on the lower surface side (back surface side) of the semiconductor element 14, and surfaces of the collar-like connection portions 56a, which are exposed on the upper surface side (front surface side) of the semiconductor element 14, by the electroless plating method In steps shown in FIG. 10D, the solder bumps 58 are mounted on the Ni/Au electrode layers 72 formed on the lower surface side (back surface side) of the semiconductor element 14.

Figure 10E:
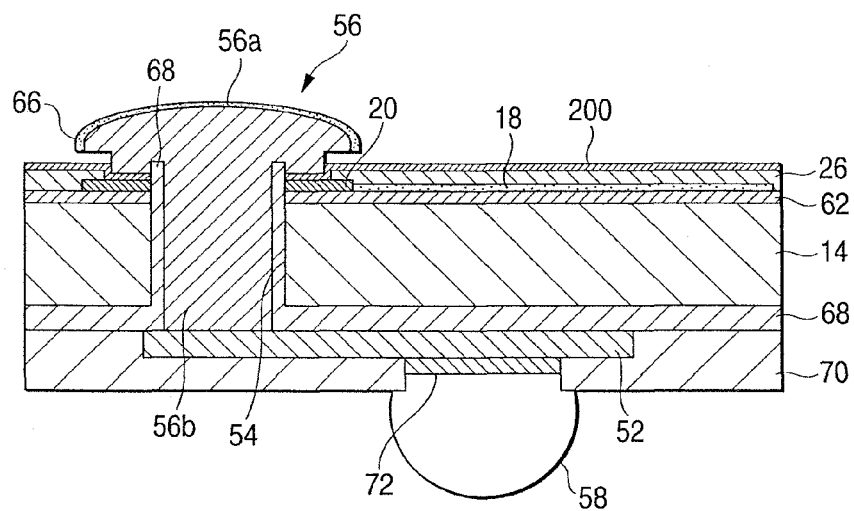
FIG. 10E is a view explaining steps (#5) of rewiring and removing the resist in the method of manufacturing the semiconductor device in Embodiment 2.

In steps shown in FIG. 10E, the first resist layer 82 left on the upper surface side (front surface side) of the semiconductor element 14 is removed. Thus, the metal layer 200 is exposed on the upper surface side.

In this manner, the first resist layer 82 for protecting the device forming layer 18 is formed at first and removed in the last step. Therefore, the device forming layer 18 can be protected until respective steps of (1) step of forming the opening, (2) step of forming the insulating layer, (3) step of forming the through electrode and step of ensuring an electrical continuity to the electrode pad, and (4) step of rewiring and removing the resist are finished.

Figure 10F:
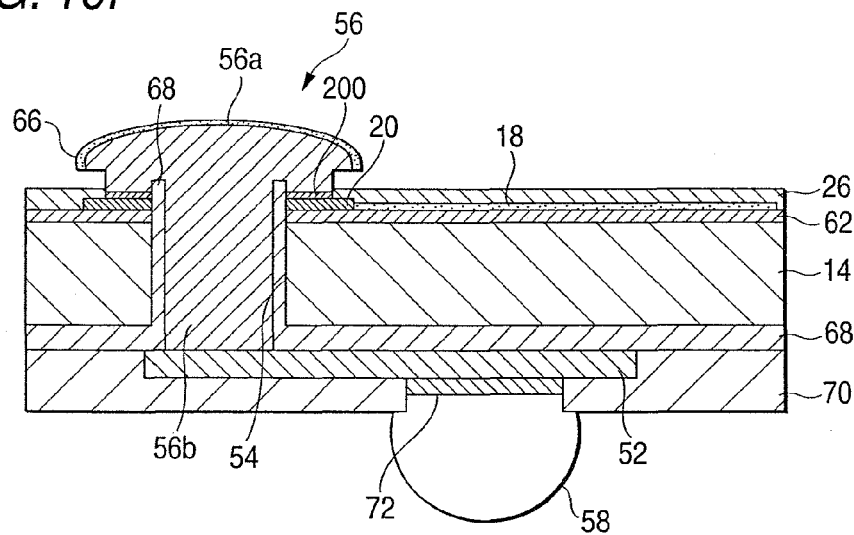
FIG. 10F is a view explaining steps (#6) of rewiring and removing the resist in the method of manufacturing the semiconductor device in Embodiment 2.

In steps shown in FIG. 10F, the metal layer 200 is removed by the wet etching method in a state that the surface of the collar-like connection portions 56a is masked by the Ni/Au electrode layer 66. Thus, the semiconductor device 50 shown in FIG. 1 is completed. Because the wet etching method is employed, the metal layer 200 can be removed not to damage the passivating layer 26 formed under the metal layer 200. In this manner, in Embodiment 2, since the metal layer 200 is formed at an initial stage of the manufacturing steps and the metal layer 200 is removed at the final stage, contamination (particle, impurity) of the device forming layer 18 and the electrostatic breakdown can be prevented.

In the embodiment, the device forming layer 18 formed on the semiconductor element 14 is not limited to the optically functioning element. It is of course that other devices may be employed.

In the embodiment, the configuration in which the device forming layer 18, the Al electrode pads 20, the passivating film 26, the through electrodes 56, and the rewiring patterns 52 are formed on the silicon substrate is cited as an example, but the present invention is not limited to this configuration. It is of course that the semiconductor substrate made of gallium arsenide, or the like may be employed in place of the silicon substrate.

In the embodiment, the case where the rewiring patterns 52 are formed on the lower surface (back surface) side of the silicon substrate is explained, but the present invention is not limited to this case. The formation of the rewiring patterns 52 may be omitted, and the solder bumps 58 may be bonded directly to the lower ends of the through electrodes 56.

In the embodiment, the method of manufacturing the semiconductor device 50 with the through electrodes 56 by obtaining the semiconductors elements 14 in which the device forming layer 18, the Al electrode pads 20, and the passivating film 26 are formed on the silicon material, which is cut out from the silicon substrate by the dicing, and then executing respective foregoing steps ((c) third manufacturing method) is explained. But the present invention is not limited to this configuration, and the first manufacturing method or the second manufacturing method may be employed. According to the first manufacturing method or the second manufacturing method, since the through electrodes 56 can be formed collectively in the silicon substrate on which a great number of semiconductors elements 14 are formed, a mass productivity can be enhanced much more.

What is claimed is:

1. A semiconductor device comprising:

a semiconductor element, which has a device forming layer and an electrode pad each formed on an upper surface side;

a wiring pattern formed on a lower surface side of the semiconductor element; and a through electrode that connects the electrode pad of the semiconductor element and the wiring pattern, wherein the electrode pad has an opening in its center, the semiconductor element has a through hole, which is communicated with the opening of the electrode pad and passes through from the upper surface side of the semiconductor element to the lower surface side of the semiconductor element, wherein the through electrode has a collar-like connection portion connected to the electrode pad over an entire circumference, and a rod-like connection portion formed in the through hole such that one end is coupled integrally to the collar-like connection portion and the other end is extended to the lower surface side of the semiconductor element, and an insulating layer which covers a lower surface of the semiconductor element, covers side walls of the through hole, and extends into the collar-like connection portion, wherein a lower surface of the insulating layer is coplanar with a lower surface of the rod-like connection portion of the through electrode, and wherein the wiring pattern is formed on the lower surface of the insulating layer and the lower surface of the rod-like connection portion of the through electrode, and covers the lower surface of the rod-like connection portion of the through electrode.

2. A semiconductor device according to claim 1, wherein the device forming layer is an optically functioning element to receive a light and emit the light.

\* \* \* \* \*